United States Patent
Zhang

(10) Patent No.: US 10,184,968 B2
(45) Date of Patent: Jan. 22, 2019

(54) E-FIELD BASED PROJECTILE DETECTION AND CHARACTERIZATION SYSTEM

(71) Applicant: Quasar Federal Systems, Inc., San Diego, CA (US)

(72) Inventor: Yongming Zhang, San Diego, CA (US)

(73) Assignee: Quasar Federal Systems, Inc., San Diego, CA (US)

( * ) Notice: Subject to any disclaimer, the term of this patent is extended or adjusted under 35 U.S.C. 154(b) by 0 days.

(21) Appl. No.: 15/638,934

(22) Filed: Jun. 30, 2017

(65) Prior Publication Data

US 2018/0003756 A1    Jan. 4, 2018

Related U.S. Application Data

(60) Provisional application No. 62/357,733, filed on Jul. 1, 2016.

(51) Int. Cl.
| | |
|---|---|
| *G01R 29/12* | (2006.01) |
| *G01S 5/24* | (2006.01) |
| *G01V 1/00* | (2006.01) |
| *G01S 5/18* | (2006.01) |
| *G01H 3/00* | (2006.01) |
| *G01V 3/08* | (2006.01) |
| *G01S 5/16* | (2006.01) |
| *G01S 3/783* | (2006.01) |

(52) U.S. Cl.
CPC ............... *G01R 29/12* (2013.01); *G01H 3/00* (2013.01); *G01S 5/18* (2013.01); *G01S 5/24* (2013.01); *G01V 1/001* (2013.01); *G01V 3/088* (2013.01); *G01S 3/783* (2013.01); *G01S 5/163* (2013.01)

(58) Field of Classification Search
CPC ....................................................... G01S 5/24
See application file for complete search history.

(56) References Cited

U.S. PATENT DOCUMENTS

| | | | | |
|---|---|---|---|---|
| 9,664,721 | B1* | 5/2017 | Noras ..................... | G01R 29/12 |
| 2005/0116720 | A1* | 6/2005 | Zank ......................... | G01S 3/14 |
| | | | | 324/451 |
| 2005/0122118 | A1* | 6/2005 | Zank ...................... | G01D 9/005 |
| | | | | 324/457 |
| 2008/0167835 | A1* | 7/2008 | Zank ......................... | G01S 5/00 |
| | | | | 702/151 |
| 2010/0142328 | A1* | 6/2010 | Beck ....................... | F41G 3/147 |
| | | | | 367/129 |

\* cited by examiner

*Primary Examiner* — Clayton E. LaBalle
*Assistant Examiner* — Jas A Sanghera
(74) *Attorney, Agent, or Firm* — Diederiks & Whitelaw, PLC

(57) ABSTRACT

A system and method use electric potential measurements to locate and characterize passing projectiles, including advanced data processing methods to reject background noise and determine projectile speed, preferentially incorporating acoustic-based measurements to provide additional benefits.

18 Claims, 5 Drawing Sheets

E-FIELD BASED PROJECTILE DETECTION AND CHARACTERIZATION SYSTEM

CROSS REFERENCE TO RELATED APPLICATIONS

This application claims the benefit of U.S. Provisional Application No. 62/357,733, which was filed on Jul. 1, 2016 and titled "E-field Based Projectile Detection and Characterization System". The entire content of this application is incorporated herein by reference.

GOVERNMENT LICENSE RIGHTS

This invention was made with government support under Contract W15QKN-14-C-0008 awarded by the United States Army. The government has certain rights in the invention.

BACKGROUND OF THE INVENTION

This invention covers a system and method for Electric-field (E-field) based projectile detection. The invention comprises an E-field sensor configuration and noise cancellation algorithm through which the system can determine the direction and speed of a projectile passing the sensors. The E-field based system can detect both supersonic and subsonic projectiles. The unique E-field signature from a projectile makes it feasible to detect multiple consecutive shots within a short time period (a few milliseconds). One embodiment includes a low-cost microphone, creating an acoustic-enabled E-field projectile detector with an improved detection rate and much lower false-alarm rate for supersonic projectiles than a detector based on E-field alone. Another embodiment combines an array of electric potential sensors and an array of microphones to form an E-field and acoustic bi-modal projectile detection system that utilizes the two orthogonal technologies to enhance the projectile detection capability. An additional embodiment is to add one or multiple electric potential sensors to an existing acoustic array-based projectile detection system to retrofit the system already built and reduce its false alarm rate.

There are various situations in which people such as military warfighters or law enforcement personnel need a real-time notification system to detect projectiles such as small-arms fire. Such a system might be free-standing, mounted on a person, or mounted on a vehicle. Projectiles, including bullets, passing through open-air regions carry an electric charge from the initial explosive combustion and triboelectric charging that occurs when the object passes through open-air regions. This charge can be sensed by an electric field (E-field) sensor or electric potential sensor. Current acoustic sensor based detection systems may become saturated or degraded by reverberation and multi-path propagation, multiple threat scenarios, high levels of acoustic noise, and vibration on vehicles. In addition, acoustic sensing based systems do not work for subsonic or silenced projectiles such as gunshots. Also, acoustic-based systems have difficulties detecting multiple consecutive shots from a single or multiple shooters if these projectiles come in a very short period of time.

SUMMARY OF THE INVENTION

The present invention is directed to a system and method for E-field based projectile detection. The system design uses multiple electric potential sensors in various configurations, including but not limited to a cross shape, which can establish the projectile's angle-of-arrival (bearing) and elevation angle. Generally, four electric potential sensors are used to determine both the azimuth and elevation angles of an incoming projectile. Additional electric potential sensors and/or acoustic sensors can be added to the system to enhance the performance. A pair of electric potential sensors can form an electric field sensor and measure the electric potential difference, which is proportional to the electric field along the axis of the sensor pair. Electric potential sensors were selected instead of E-field sensors since the potential sensor can detect a charge from farther away. However, the term "E-field based detection" is still used for this invention.

In addition, the invention includes a detection algorithm that uses the measured electric potential of each electrode, induced by the charged projectile traveling in the air when it passes the sensor node, and uses the time differences of the corresponding peaks of sensing electrodes to calculate the desired angle(s).

Further, the invention preferentially includes an effective algorithm that cancels the powerline interference at 60 Hz and/or 50 Hz and its harmonics effectively without using an additional reference sensor but instead using a copy of the collected data itself as a reference.

Further, the invention preferentially includes algorithms to reject 1) sferic signals or impulse signals generated by distant sources, and/or 2) charged particle induced signals.

Additionally, the invention can include a method to determine the speed of the projectile using the time difference between the electrodes. Using the determined speed of a projectile, different types of projectiles can be discriminated between and unwanted events can be rejected.

Further, the invention can include (optional) one or multiple reference electric potential sensors at a standoff from the main detection sensors to cancel the common interference signals such as sferics, power line interference, and impulses generated by distant sources.

Also, the invention can include an enhanced detection method that utilizes the shockwave signatures from the passing projectile to enhance the measurement, extend the detection range, and reduce the false-alarm rate.

The invention can include adding the electric field signature from a passing projectile (by a single electric potential sensor) to an acoustic based gunshot detection system to greatly reduce the false-alarm rate.

Finally, the invention can include combining multiple electric potential sensors with multiple acoustical sensors to build an acoustic-electric (A-E) bi-modal projectile detection system with much improved performance in providing a higher detection rate and lower false alarm rate, especially in complex urban environments.

Additional objects, features and advantages of the invention will become more readily apparent from the following detailed description of preferred embodiments thereof when taken in conjunction with the drawings wherein like reference numerals refer to common parts in the several views.

BRIEF DESCRIPTION OF THE DRAWINGS

The present invention is described with respect to particular exemplary embodiments thereof and reference is accordingly made to the drawings in which.

DETAILED DESCRIPTION OF THE INVENTION

Detailed embodiments of the present invention are disclosed herein. However, it is to be understood that the disclosed embodiments are merely exemplary of the invention that may be embodied in various and alternative forms. The figures are not necessarily to scale, and some features may be exaggerated or minimized to show details of particular components. Therefore, specific structural and functional details disclosed herein are not to be interpreted as limiting, but merely as a representative basis for teaching one skilled in the art to employ the present invention.

System Hardware

Figure 1:
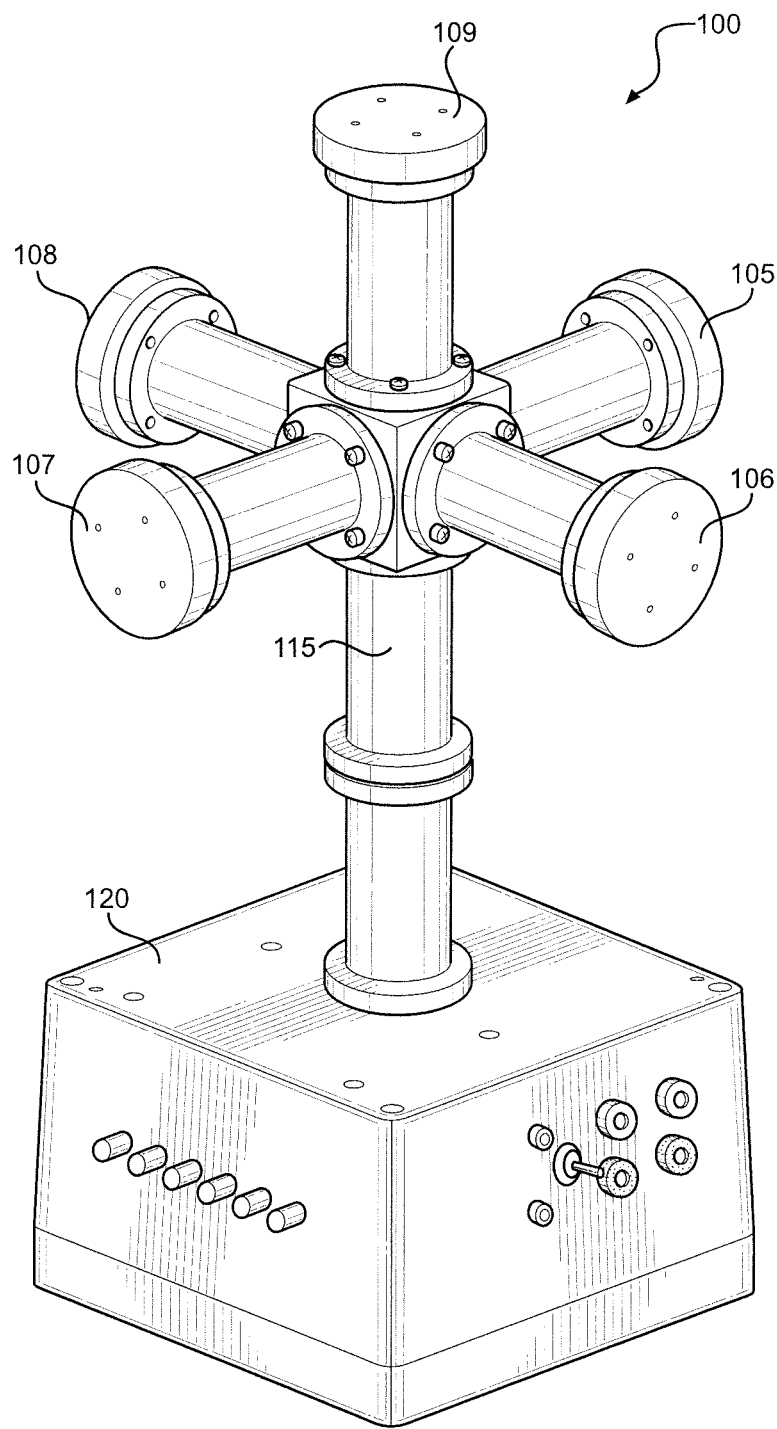
FIG. 1 is an illustration of one embodiment of the system hardware of the invention.

The key component of the system is an integrated sensing module 100, a preferred configuration of which comprises five electric potential sensors (electrodes) 105-109, as shown in FIG. 1. Each electrode 105-109 measures the electric potential at its measurement location, and four sensors 105-108 in the same plane can determine the bearing angle (also called angle of arrival) of a passing projectile. The elevated electrode 109 in the middle can be used to calculate the vertical electric field and the elevation angle of the projectile. It is not necessary to implement all five electrodes 105-109—for example, if only the azimuth angle information is desired, four sensors are adequate. A bearing calculation can be produced with three electrodes. The numbers and configurations of the electrodes may vary. Sensing electrodes can also be distributed at the measurement location, such as at corners of a vehicle or an objective gun protection kit (OGPK) on a military vehicle. Optional acoustic sensors such as microphones can be added to the system to enhance the detection performance or build an E-field/acoustic bi-modal detection system.

A non-conductive universal hollow armature 115 is designed to enable the capability to reconfigure the measurement baseline. Proper separation of electrodes 105-109 is important for achieving the desired angle-of-arrival accuracy.

An enclosure 120 integrated at the base of sensor module 100 provides the battery power, filtering, and cable drivers for sensors 105-109. Enclosure 120 can also be moved away from the base of sensor module 100.

A data acquisition and processing module (i.e., a controller) is added to digitize the outputs from electrodes 105-109 and process the data. The number of channels can vary depending on how many sensors are implemented and whether one or more acoustic sensors are added. The module can be integrated within enclosure 120. The sampling rate of the digitizer for data acquisition is also important for achieving the desired angle-of-arrival accuracy. A 16-bit or 24-bit digitizer with sampling rate above 20 kilosamples/second (kS/s) for each channel is preferred.

System Software

Figure 2:
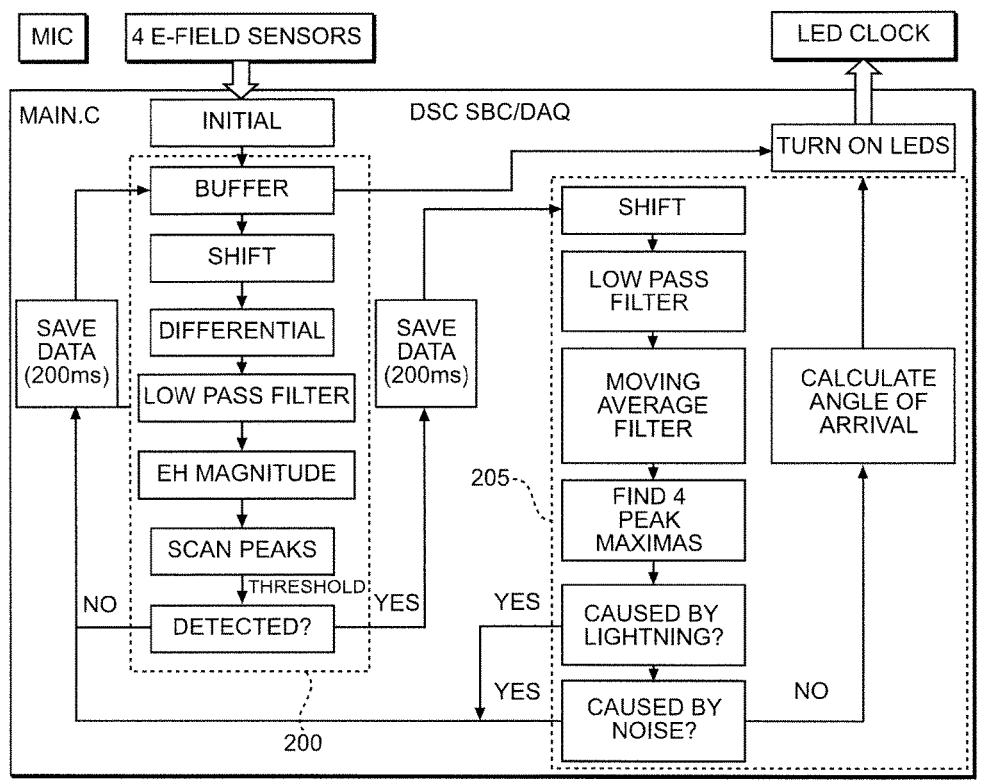
FIG. 2 shows a typical flow chart for the system software.

The invention includes purpose designed software, implemented by the controller, to perform the following functions. A typical flowchart for the software is shown in FIG. 2.

Noise cancellation: cancel power line interference (50 or 60 Hz and its harmonics) or atmospheric noise (sferics) and reject low frequency noise induced events.

Reject 60 Hz: cancel 60 Hz and its harmonics from power sources.

Reference sensor (optional function): use a reference electric potential sensor to cancel the motion noise and/or a compact magnetic field (B-field) sensor to cancel the 60 Hz and harmonics.

Low-pass (LP) Filter: an LP filter with a corner frequency about 1 kHz. The majority of the projectile's signal energy is often below 2 kHz. This will remove noise above the corner frequency, especially rejection of sferic noise produced by lightning events.

Reject sferic events: if the time differences for the event peaks between all electrodes are zero, the event is due to sferics and is rejected.

Reject noise-induced events: if the time difference between channels is longer than 15 milliseconds (ms) for an event, then it is rejected as it is too slow to be a moving bullet. These events can be induced by passing charged particles, charged human, etc.

Reject motion induced noise: the algorithm to reject 60 Hz noise can also reject slow motion-induced noise.

Event detection (marked by a box 200 in FIG. 2): identify a trigger (charged projectile passing event) based on the measured electric potential from four electrodes on the same horizontal plane. Some or all of the following can be implemented:

Differential: The (x, y) axis differential voltages are determined. Ex (=Vxp−Vxm) and Ey (=Vyp−Vym) are calculated directly from two potential sensors along that direction. Ex and Ey are proportional to electric-fields along their axes.

Magnitude Horizontal Eh: The magnitude of the horizontal axis differential voltage is calculated. $|Eh|=(Ex^2+Ey^2)^{1/2}$ Threshold Detection: An Eh peak-detect search is done to identify valid events.

Peak: If a valid event is detected, the routine proceeds with the angle detection. A small window of data is then extracted around the peak event from the raw data.

Acoustic peak confirmation: A supersonic projectile generates a shockwave from the nearest passing point, and the shockwave travels to the sensor node at the speed of sound at a delayed time given by the equation passing distance/speed of sound. This unique feature can be used to reject any detected event that does not have a shockwave signature within a defined time window. This function block is optional (and is only valid for supersonic projectiles) and can be very effective to reject false alarms induced by local charges, motions and other causes when detecting supersonic projectiles.

Figure 3:
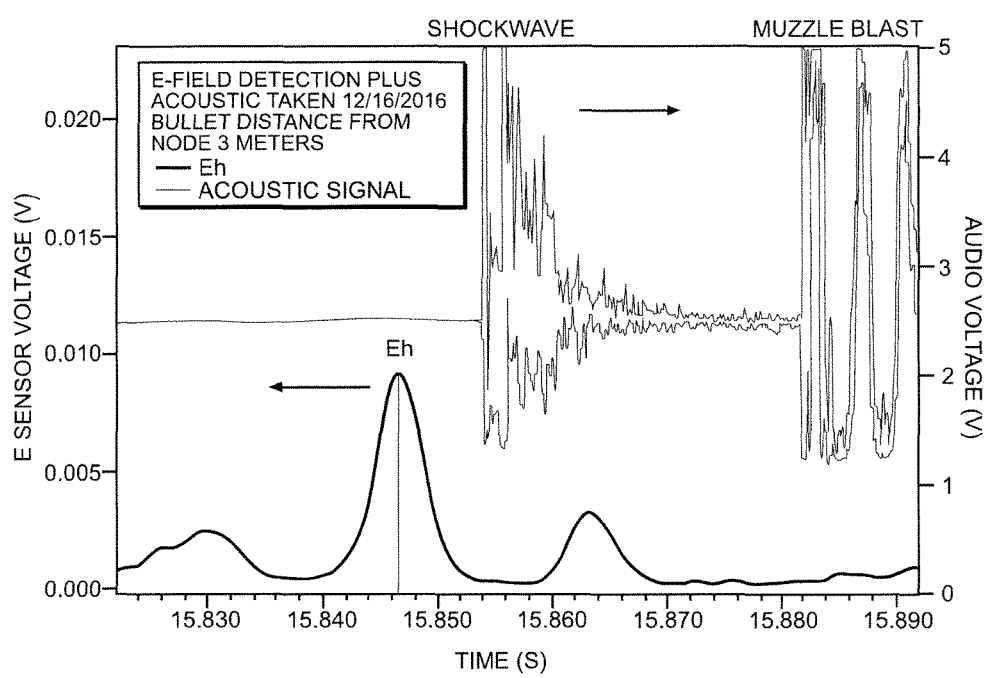
FIG. 3 is an illustration of characteristic acoustic and E-field Eh signals for a bullet passing the sensor node at 3 meters. The shockwave is about 7.8 milliseconds behind the E-field response peak. This figure illustrates the principle of combining orthogonal acoustic and electric field signals to develop an improved gunshot detection system.

FIG. 3 shows acoustic and E-field Eh signals for a bullet passing the sensor node at 3 meters. The shockwave is about 7.8 ms behind the E-field response peak in FIG. 3. In principle, the delay should be 3/340=8.8 ms; the 1 ms discrepancy is due to instrumentation delays in the acoustic measurement that can be calibrated out.

Angle and distance determination: based on the time of the induced electric potential peak on each sensor (marked by a box 205 in FIG. 2).

Find peak times: The peak time is determined by methods including but not limited to a simple max/min detection or a Gaussian fit.

Reject false events: Based on the peak times of some number of the electrodes, it is possible to reject false events due to sferics (same peak times for all electrodes), low frequency noise induced by human motion around the sensor, charged particles, and other noise sources.

Calculate angle and distance: A preferable method of performing this function is using the peak times from different electrodes and determining the angle of projectile arrival as discussed below in connection with FIG. 4. The distance to the point of projectile initiation can be calculated by using the time difference between the Vz peak (traveling at the projectile's speed) and the muzzle blast (travelling at the speed of sound) measured by the microphone. The projectile speed can be determined by the time differences between different electrodes when the projectile passes the node.

Figure 4:
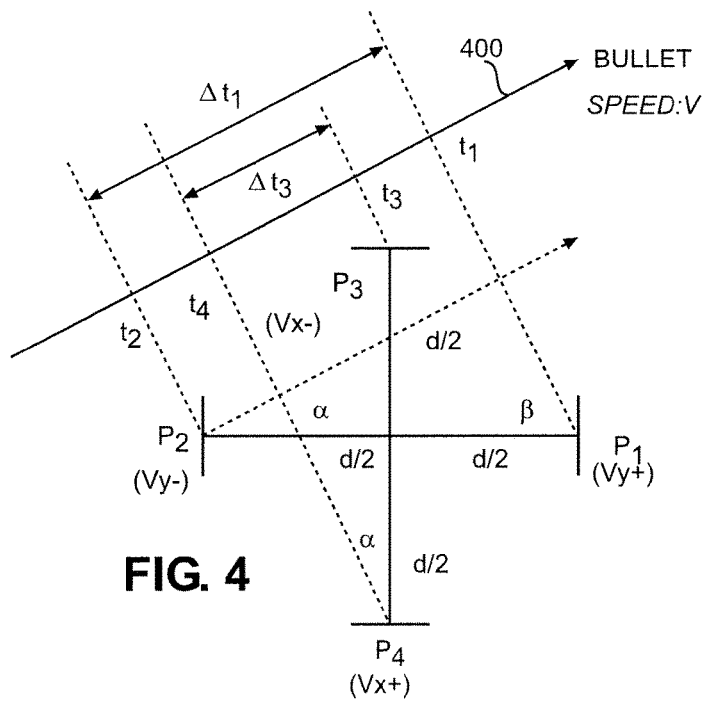
FIG. 4 shows a method of detecting the angle of arrival of a projectile (in this case, a bullet) with four sensing electrodes.

In FIG. 4, a bullet, traveling at speed v, along a trajectory 400, is detected by four potential sensors $P_1, P_2, P_3, P_4$ on the same plane. The bearing α of the bullet is determined, using Equation 1, by the time of arrival ($t_1, t_2, t_3, t_4$) of the waveforms measured by each sensor. $\Delta t_1$ is the waveform peak time difference measured by electrode $P_1$ (Vy+) and $P_2$ (Vy−), while $\Delta t_3$ is the waveform peak time difference measured by electrode $P_3$ (Vx−) and $P_4$ (Vx+).

$$\sin \alpha = \Delta t_3 / (\Delta t_1^2 + \Delta t_3^2)^{0.5} \quad [1]$$

Figure 5:
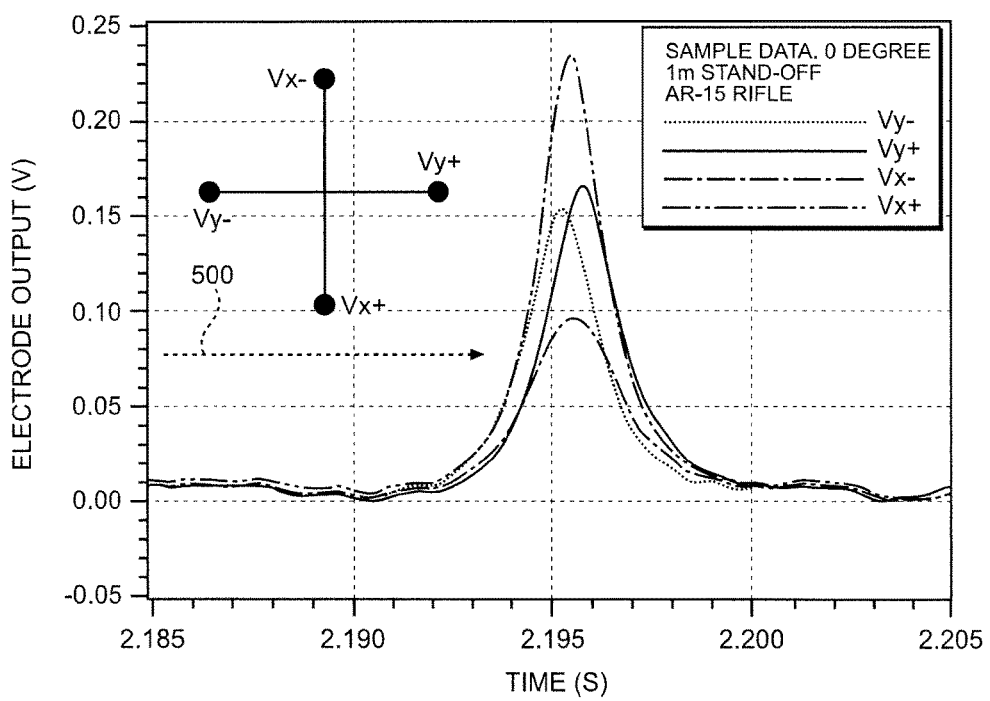
FIG. 5 shows an example of sensor output waveforms.

FIG. 5 shows sample sensor output waveforms collected for α=0, with the bullet's path labeled 500.

The angle of arrival is calculated using a waveform peak time based algorithm. If the projectile travels on the same plane as the four electrodes ($P_1, P_2, P_3, P_4$) when it passes the sensor, the projectile bearing α (the angle between the bullet trajectory and the Vy− to Vy+ axis) can be calculated using Equation 1 with the peak times of electric potential measured by four sensors in the cross configuration. To be more specific, a is calculated using the time delay $\Delta t_1$ and $\Delta t_3$. Equation 1 is derived using the time delay $\Delta t_1$ and $\Delta t_3$, as shown by Equations 2 and 3 where d is the distance between electrodes $P_1$ and $P_2$ and between electrodes $P_3$ and $P_4$, and k is a scaling factor that is due to the metallic object around the electrode.

$$\Delta t_1 = kd \cos \alpha / v \quad [2]$$

$$\Delta t_3 = kd \sin \alpha / v \quad [3]$$

As can be seen from the equation to determine the projectile's angle of arrival (a), that angle depends on the peak time differences $\Delta t_1$ and $\Delta t_3$. The angle accuracy is therefore determined by the time accuracy (the sampling rate of data collection, 50 μs for 20 kS/s) and the physical spacing between a pair of electrodes. An advantage of the method is the result does not rely on the response amplitudes of the sensor, which could be distorted by nearby conductive objects.

Figure 6:
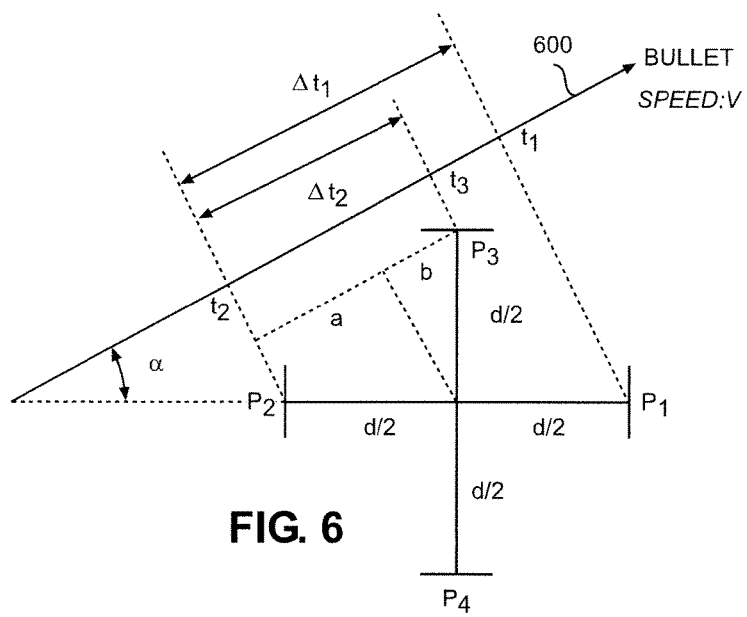
FIG. 6 shows a method of determining the angle of arrival of a projectile (in this case, a bullet) with three sensing electrodes.

In another method, without limitation, an algorithm was developed that works with only three electrodes in a half cross configuration. As shown in FIG. 6, the projectile's arrival angle can be determined by using three sensors—$P_1$, $P_2$, $P_3$—that are close to its trajectory 600. The time differences $\Delta t_1$ and $\Delta t_2$ between the measured voltage peaks of these electrodes determine the angle of arrival α uniquely using Equation 4. Equation 4 can also be used to calculate the elevation of the projectile if its trajectory is on the same vertical plane as the sensor $P_1, P_2, P_3$, where $P_3$ is the vertical electrode (Vz) and $P_1$ and $P_2$ are two electrodes below Vz (such as Vy+ and Vy−).

$$\tan \alpha = 2\Delta t_2 / \Delta t_1 - 1 \quad [4]$$

Determination of a Projectile's Velocity

The invention can also determine the speed of a projectile passing the node. As shown in FIG. 4, the projectile speed v can be calculated using the time delay $\Delta t_1$ and $\Delta t_3$, as shown by Equation 5.

$$v = kd / (\Delta t_1^2 + \Delta t_3^2)^{0.5} \quad [5]$$

If we know the angle-of-arrival α, we can also use the time difference ($\Delta t_1$) to determine the projectile's speed v using Equation 6.

$$v = kd \cos \alpha / \Delta t_1 \quad [6]$$

The capability to determine the projectile's speed can be used to characterize the detected projectile, to discriminate between supersonic and subsonic projectiles and as a discriminator to reject false events such as responses due to a charged particle flying nearby the sensor.

Algorithm to Cancel Interference Noise

During system operation, power line interference at 60 Hz (or 50 Hz) and its harmonics can be as high as a few volts while the projectile signal for some embodiments is on the order of 20-100 mV. To detect the projectile and track its direction, it is important to cancel the powerline interference. The invention includes an effective noise cancellation algorithm that removes the 60 Hz noise and its harmonics from the collected data effectively. Assuming the collected raw signal is V(t) by a sensing electrode, since the background noise is repeatable at a period of 1/60 seconds, Equation 7 can be used to cancel the 60 Hz and its harmonics effectively without impacting the projectile signatures.

$$V'(t) = V(t) - V\left(t - \frac{1}{60} * n\right) \quad [7]$$

The V' is the signal after the noise cancellation, where n is an integral number (positive or negative). Since the second term in Equation 7

$$\left(\text{i.e., } V\left(t - \frac{1}{60} * n\right)\right)$$

is a copy of the signal with time shifted n/60 seconds (for n=1, that corresponds to 1 period of 60 Hz), this cancellation method is called the "shift cancellation" approach. There are several observations during the implementation:

1) The method works well for periodic noise. However, if the copy of the signal has drifted from the original signal after a time period of n/60 due to the phase of the signal being unstable over time, the single shift cancellation may not work very well. To overcome this issue, a small n (as small as 1) can be selected or a number n=m+f, where m is an integer and f is a fractal number, can be found.

Figure 7:
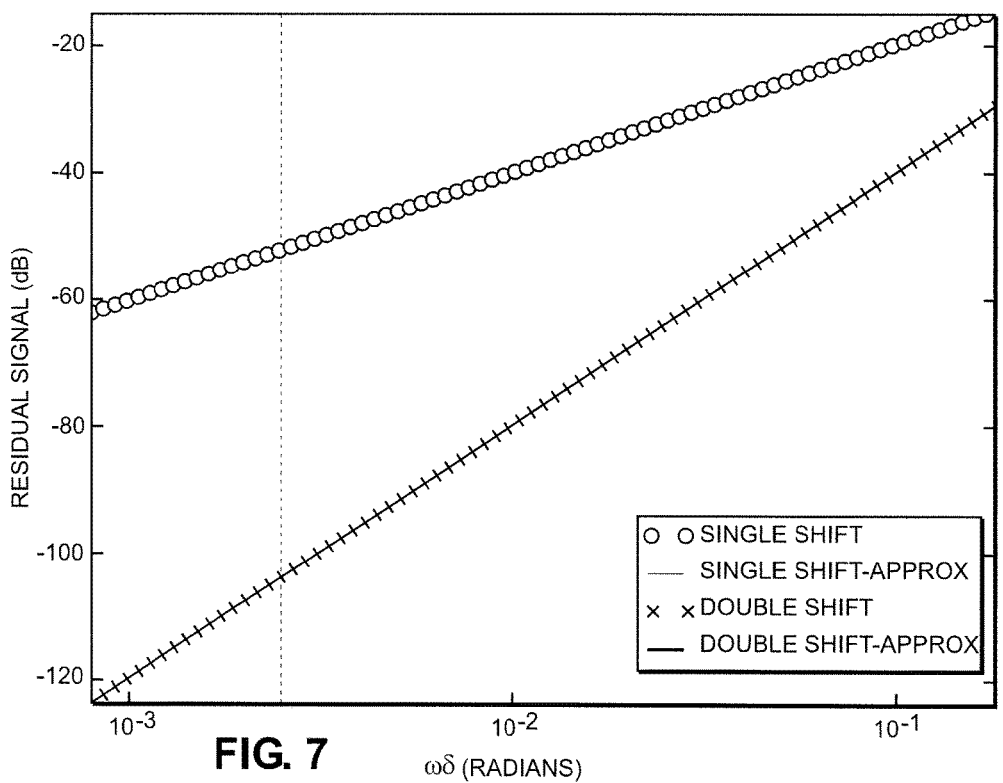
FIG. 7 shows a method of cancelling powerline interference noise.

2) Using the double shifts to perform the single period shifts twice. With double shifts, Equation 7 is applied twice to the raw data, achieving 100 dB interference reduction, while a single shift can only reduce the interference by over 50 dB. FIG. 7 shows the signal cancellation over a range of offset values, in this case scaled by ω. The dashed vertical line indicates the offset value for an interference centered at 60 Hz with an error in the estimated period of the interference δ=6.67 μs (i.e., ωδ=2.513 E-3). As the offset increase, the residual signal increases significantly.

3) Using an averaging shifted copy as the reference to achieve effective noise cancellation in one step without searching the n factor, as shown in Equation 8. It achieves the same interference reduction as the double shift, but the calculation is two times more efficient. It can also address the phase stability issue of the interference automatically.

$$V'(t) = V(t) - \left(V\left(t - \frac{1}{60}\right) + V\left(t + \frac{1}{60}\right)\right)/2 \quad [8]$$

FIG. 7 shows signal cancellation following single and double shift and subtraction as a function of the offset term ωδ, where ω is the angular frequency and δ is the error in the estimated period. The signal amplitude is now reduced by $\omega^2\delta^2$ as opposed to ωδ for the single shift and subtract.

The interference algorithm can be used for detecting impulse signals such as sferic signals under high power line interference background.

Enhanced Projectile Detection Using Integrated E-Field and Acoustic Measurements When a supersonic projectile passes a sensor node, a shockwave travels to the node at the speed of sound from the nearest passing point, while the projectile charge can be detected by the E-field sensor in real time. For E-field and acoustic sensors integrated on the same node, the acoustic shockwave is delayed by dt (=passing distance/sound speed) from the E-field response peak, since the speed of the EM wave is much faster than the speed of the sound. For a distance of 4 meters, the delay is about 12 ms.

By combining E-field detection of the projectile charge and acoustic detection of the shock wave generated by a supersonic projectile passing the sensor node, the performance (especially the false alarm rate) of an E-field based projectile detector and/or an acoustic sensor based projectile detector can be greatly improved. Three possible systems can be developed.

A) E-field based projectile detector: an array of E-field sensors can be integrated with an acoustic sensor such as a microphone. The acoustic sensor can detect the shockwave (with filtering and threshold) and identify the projectile event instead of using the Eh, so levels below the defined threshold for Eh (such as 10 mV) can still be detected. The E-field peaks 12 ms before the shockwave will be searched (for any projectile passing the sensor within a distance of approximately 4 meters, corresponding to about 3 ms for every meter passing distance). If E-field peaks are found, the data will be processed; if no E-field peaks are found, the shockwave event is designated a false event. False events will be rejected further based on the E-field event waveforms, and finally bearing angles will be calculated for "good" events.

B) Acoustic based projectile detector: this approach applies to a standard projectile detector using an array of acoustic sensors (such as a Boomerang® bullet detection system developed by BBN®). However, false alarms are a concern for the system because sound waves tend to be "multi-path" or reflected. The system can also lose operational capability in the battlefield because of the high levels of background acoustical noise from tanks, planes, and munition explosions. By adding one or more E-field electrodes to the node, the detection of a supersonic projectile can be confirmed if it passes the sensor node within 4-5 meters: after the sensor node detects the shockwave, the system checks whether the E-field sensor has detected any potential peak around 12 ms (for 4 m offset distance) before the acoustic shockwave. If the E-field peak is found within the time window and the waveform can fit to a typical passing projectile, the detection is confirmed and angle-of-arrival will be calculated. This process is able to dramatically reduce false alarm rates.

C) Fused E-field and acoustic projectile detector: an array of E-field sensors can be combined with an array of acoustic sensors to develop a fused bi-modal detector. The fused detector can mitigate the shortcomings of each individual mode alone: 1) detect subsonic projectiles, multiple rapid fires, cross fires, and shots with suppressors using E-field mode; and 2) detect supersonic projectiles at much farther distance of closest approach to the sensors (up to 30 meters) in the acoustic mode.

Based on the above, it should be readily apparent that the present invention provides an E-field sensor configuration and noise cancellation algorithm through which the system can determine the direction and speed of a projectile passing the sensors. The E-field based system can detect both supersonic and subsonic projectiles. The unique E-field signature from a projectile makes it feasible to detect multiple consecutive shots within a short time period (a few milliseconds). The E-field system can be combined with one or more acoustic sensors to improve the detection rate and provide a much lower false-alarm rate for supersonic projectiles than a detector based on E-field alone. Although described with reference to preferred embodiments, it should be readily understood that various changes or modifications could be made to the invention without departing from the spirit thereof. In general, the invention is only intended to be limited by the scope of the following claims.

The invention claimed is:

1. An electric field-based projectile detection and characterization system comprising:
   a plurality of electric potential sensors, wherein at least one of the plurality of electric potential sensors is mounted at a fixed location relative to at least one other sensor of the plurality of electric potential sensors;
   an acoustic sensor; and
   a controller configured to 1) receive signals from the plurality of electric potential sensors and from the acoustic sensor, 2) detect a passing projectile based on the signals and 3) and determine at least one of a bearing angle, an elevation angle or a velocity of the projectile based on the signals.

2. The system of claim 1, wherein each of the plurality of electric potential sensors is mounted at a fixed location relative to a remainder of the plurality of electric potential sensors.

3. The system of claim 2, wherein the plurality of electric potential sensors includes four electric potential sensors mounted in a cross shape.

4. The system of claim 3, wherein the plurality of electric potential sensors includes a fifth electric potential sensor mounted outside a plane defined by the four electric potential sensors mounted in the cross shape.

5. The system of claim 1, wherein the acoustic sensor is a microphone configured to detect a shockwave generated by a passing projectile.

6. The system of claim 1, wherein the controller is configured to determine the bearing angle of the projectile based on a time difference calculated using the signals.

7. The system of claim 1, wherein the controller is configured to determine the elevation angle of the projectile based on a time difference calculated using the signals.

8. The system of claim 1, wherein the controller is configured to determine the velocity of the projectile based on a time difference calculated using the signals.

9. The system of claim 1, wherein the controller is configured to cancel powerline interference using the signals using shift cancellation.

10. The system of claim 1, wherein the controller is configured to reject sferic events based on a time difference calculated using the signals.

11. The system of claim 1, wherein the controller is configured to reject slow events due to passing charged particles based on a time difference calculated using the signals.

12. A method of detecting and characterizing a projectile based on electric fields, the method comprising:
   measuring an electric potential with each of a plurality of electric potential sensors, wherein at least one of the plurality of electric potential sensors is mounted at a fixed location relative to at least one other sensor of the plurality of electric potential sensors;
   receiving signals from the plurality of electric potential sensors and from an acoustic sensor;
   detecting a passing projectile based on the signals; and
   determining at least one of a bearing angle, an elevation angle or a velocity of the passing projectile based on the signals.

13. The method of claim 12, wherein determining at least one of the bearing angle, the elevation angle or the velocity of the passing projectile includes determining the bearing angle of the passing projectile based on a time difference calculated using the signals.

14. The method of claim 12, wherein determining at least one of the bearing angle, the elevation angle or the velocity of the passing projectile includes determining the elevation angle of the passing projectile based on a time difference calculated using the signals.

15. The method of claim 12, wherein determining at least one of the bearing angle, the elevation angle or the velocity of the passing projectile includes determining the velocity of the passing projectile based on a time difference calculated using the signals.

16. The method of claim 12, further comprising canceling powerline interference using the signals using shift cancellation.

17. The method of claim 12, further comprising rejecting sferic events based on a time difference calculated using the signals.

18. The method of claim 12, further comprising rejecting slow events due to passing charged particles based on a time difference calculated using the signals.

* * * * *